(12) United States Patent
Kusaka et al.

(10) Patent No.: US 7,972,944 B2
(45) Date of Patent: Jul. 5, 2011

(54) PROCESS SIMULATION METHOD, SEMICONDUCTOR DEVICE MANUFACTURING METHOD, AND PROCESS SIMULATOR

(75) Inventors: Tomomi Kusaka, Kanagawa-ken (JP); Takahisa Kanemura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/614,912

(22) Filed: Nov. 9, 2009

(65) Prior Publication Data

US 2010/0178757 A1  Jul. 15, 2010

(30) Foreign Application Priority Data

Jan. 9, 2009 (JP) .................................. 2009-003226

(51) Int. Cl.
*H01L 21/26* (2006.01)
*H01L 21/42* (2006.01)

(52) U.S. Cl. ...................................... 438/513; 438/514

(58) Field of Classification Search .............. 438/5, 513, 438/514
See application file for complete search history.

(56) References Cited

U.S. PATENT DOCUMENTS

2007/0224840 A1* 9/2007 Renau et al. .................. 438/798
2009/0081858 A1* 3/2009 Qin et al. ...................... 438/527

FOREIGN PATENT DOCUMENTS

JP    2003197493    7/2003

OTHER PUBLICATIONS

Tian, Xiubo et al, "Modeling of the relationship between implantation parameters and implantation dose during plasma immersion ion implantation," 2000 Physics Letters A 277 p. 42-46.*
M. A. Lieberman, "Model of plasma immersion ion implantation," Oct. 1, 1989, Journal of Applied Physics 66 (7) p. 2926-2929.*
Sasaki, et al.; B2H6 Plasma Doping With In-Situ He Pre-amorphization; Symposium On VLSI Technology Digest Of Technical Papers; 2004; pp. 180-181.
Takase, et al.; Shallow Source/Drain Extensions for pMOSFETs With High Activation And Low Process Damage Fabricated By Plasma Doping; IEEE; 1997; pp. 475-478.

* cited by examiner

*Primary Examiner* — Charles D Garber
*Assistant Examiner* — Bryan R Junge
(74) *Attorney, Agent, or Firm* — Turocy & Watson, LLP

(57) ABSTRACT

A process simulation method includes: converting condition data of plasma doping for introducing an impurity into a semiconductor in a plasma atmosphere to corresponding condition data of ion implantation for implanting impurities as an ion beam into the semiconductor; and calculating device structure data on the basis of the ion implantation condition data converted from the plasma doping condition data.

9 Claims, 6 Drawing Sheets

| Apparatus name | Plasma doping condition ||||| Equivalent ion implantation condition |||||||| 
| | He flow rate | Ne flow rate | B₂H₆ flow rate | RF output | B || H || He || Ne ||
| | | | | | Implantation energy | Dose amount | Implantation energy | Dose amount | Implantation energy | Dose amount | Implantation energy | Dose amount |
|---|---|---|---|---|---|---|---|---|---|---|---|---|
| ... | ... | ... | ... | ... | ... | ... | ... | ... | ... | ... | ... | ... |
| A | 5 | 0 | 0.1 | 300 | 0.4 | $1.5 \times 10^{15}$ | 0.4 | $4.5 \times 10^{15}$ | 0.4 | $1.0 \times 10^{17}$ | | 0 |
| A | 5 | 0 | 0.1 | 500 | 0.6 | $1.5 \times 10^{15}$ | 0.6 | $4.5 \times 10^{15}$ | 0.6 | $1.0 \times 10^{17}$ | | 0 |
| A | 5 | 0 | 0.1 | 700 | 0.8 | $1.5 \times 10^{15}$ | 0.8 | $4.5 \times 10^{15}$ | 0.8 | $1.0 \times 10^{17}$ | | 0 |
| A | 5 | 0 | 0.2 | 300 | 0.4 | $3.0 \times 10^{15}$ | 0.4 | $9.0 \times 10^{15}$ | 0.4 | $1.0 \times 10^{17}$ | | 0 |
| A | 5 | 0 | 0.2 | 500 | 0.6 | $3.0 \times 10^{15}$ | 0.6 | $9.0 \times 10^{15}$ | 0.6 | $1.0 \times 10^{17}$ | | 0 |
| A | 5 | 0 | 0.2 | 700 | 0.8 | $3.0 \times 10^{15}$ | 0.8 | $9.0 \times 10^{15}$ | 0.8 | $1.0 \times 10^{17}$ | | 0 |
| ... | ... | ... | ... | ... | ... | ... | ... | ... | ... | ... | ... | ... |
| B | 10 | 1 | 0.1 | 100 | 0.1 | $1.5 \times 10^{15}$ | 0.1 | $4.5 \times 10^{15}$ | 0.1 | $2.0 \times 10^{17}$ | | 0 |
| B | 10 | 1 | 0.1 | 200 | 0.3 | $1.5 \times 10^{15}$ | 0.3 | $4.5 \times 10^{15}$ | 0.3 | $2.0 \times 10^{17}$ | | 0 |
| B | 10 | 1 | 0.1 | 400 | 0.5 | $1.5 \times 10^{15}$ | 0.5 | $4.5 \times 10^{15}$ | 0.5 | $2.0 \times 10^{17}$ | | 0 |
| ... | ... | ... | ... | ... | ... | ... | ... | ... | ... | ... | ... | ... |

Units; Flow rate[sccm], RFoutput[W], Dose amount[cm⁻²], Ion implantation energy[keV]

FIG. 7

PROCESS SIMULATION METHOD, SEMICONDUCTOR DEVICE MANUFACTURING METHOD, AND PROCESS SIMULATOR

CROSS-REFERENCE TO RELATED APPLICATIONS

This application is based upon and claims the benefit of priority from the prior Japanese Patent Application No. 2009-003226, filed on Jan. 9, 2009; the entire contents of which are incorporated herein by reference.

BACKGROUND

In semiconductor device development, TCAD (technology computer aided design) is actively used for purposes of electrical characteristics prediction and failure analysis in devices (see, e.g., JP-A-2003-197493 (Kokai)).

The impurity diffusion layer in a semiconductor device, such as a field effect transistor, significantly affects the device characteristics. Recently, a shallow and steep junction has been formed by plasma doping, as well as ion implantation in which impurities are implanted as ion beams into a semiconductor wafer.

SUMMARY

According to an aspect of the invention, there is provided a process simulation method including: converting condition data of plasma doping for introducing an impurity into a semiconductor in a plasma atmosphere to corresponding condition data of ion implantation for implanting impurities as an ion beam into the semiconductor; and calculating device structure data on the basis of the ion implantation condition data converted from the plasma doping condition data.

According to another aspect of the invention, there is provided a semiconductor device manufacturing method including: converting condition data of plasma doping for introducing an impurity into a semiconductor in a plasma atmosphere to corresponding condition data of ion implantation for implanting an impurity as an ion beam into the semiconductor; calculating device structure data on the basis of the ion implantation condition data converted from the plasma doping condition data; evaluating the plasma doping condition data on the basis of the device structure data; specifying a plasma doping condition on the basis of the evaluation; and introducing an impurity in the semiconductor by plasma doping based on the specified plasma doping condition.

According to still another aspect of the invention, there is provided a process simulator including a process of introducing an impurity into a semiconductor by plasma doping, the process simulator including: an input device configured to receive condition data of plasma doping as input; and a processing device configured to convert the inputted condition data of plasma doping to corresponding condition data of ion implantation for implanting an impurity as an ion beam into the semiconductor and calculate device structure data on the basis of the ion implantation condition data.

BRIEF DESCRIPTION OF THE DRAWINGS

FIG. 7 is an example of a data table.

DETAILED DESCRIPTION

Plasma doping is a technique in which a gas containing impurities to be implanted and a carrier gas are turned into a plasma in a chamber, and ions are accelerated toward and implanted into a wafer by the potential difference between opposed electrodes. In this plasma doping, ions are not passed through an energy filter such as used in an ion implantation apparatus. That is, the plasma in plasma doping contains not only monatomic ions desired to be implanted, but also other atomic and molecular ions resulting from the carrier gas and the like. Thus, numerous ion species are implanted into the wafer. Furthermore, there is some spread in the effective energy with which each ion is accelerated. Moreover, the dose amount of each ion species is often unknown in detail.

In this context, simulation of plasma doping requires input of energy, dose amount and the like for each of the numerous ion species, which causes the problem of extremely complicating the preparation of input data. In the first place, it is difficult to obtain accurate data required for the preparation of input data.

A process simulator and a device simulator are used in TCAD (technology computer aided design) for simulating and predicting semiconductor device characteristics. The process simulator receives process conditions as input, and outputs device structure data. The device simulator receives as input the device structure data obtained by the process simulator, and outputs device characteristics data.

Figure 1:
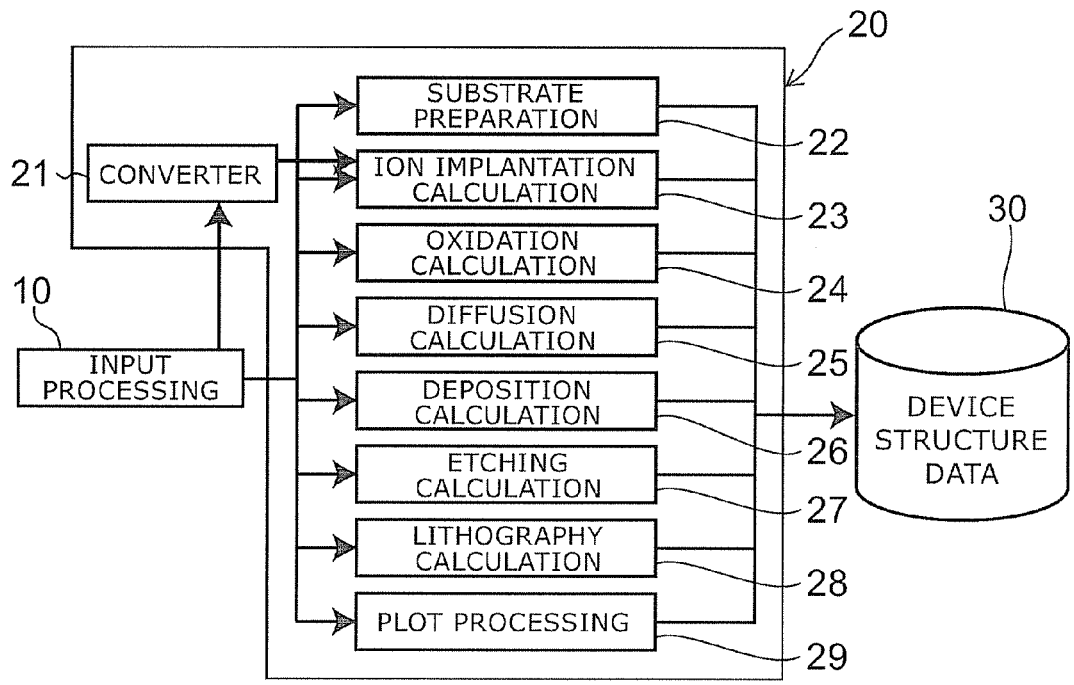
FIG. 1 shows functional blocks of a process simulator according to an embodiment.

FIG. 1 shows functional blocks of a process simulator according to an embodiment.

The process simulator according to this embodiment includes an input device 10, a processing device 20, and a memory device 30.

The input device 10 is illustratively a keyboard or touch panel and performs input processing on various input data. The processing device 20 receives the input data inputted through the input device 10 and performs various processes thereon, and the processed results, such as device structure data, are stored in the memory device 30. Here, the input contents and processed results can be outputted to an output device (such as a display or printer), not shown.

The processing device 20 includes a converter 21, a substrate preparation section 22, an ion implantation calculation section 23, an oxidation calculation section 24, a diffusion calculation section 25, a deposition calculation section 26, an etching calculation section 27, and a lithography calculation section 28, and suitably applies these calculation sections as necessary to calculate device structure data. The processing device 20 also includes a plot processing section 29 which graphically represents the calculation result of each calculation section.

The ion implantation calculation section 23 receives as input the condition of ion implantation by ion beams, such as implanted ion species, implantation energy, and dose amount, and calculates an impurity concentration distribution and point defect distribution in the semiconductor. Here, when the process based on ion implantation is simulated, the ion species, implantation energy, and dose amount are inputted through the input device 10, and these input data are directly given to the ion implantation calculation section 23.

Figure 2:
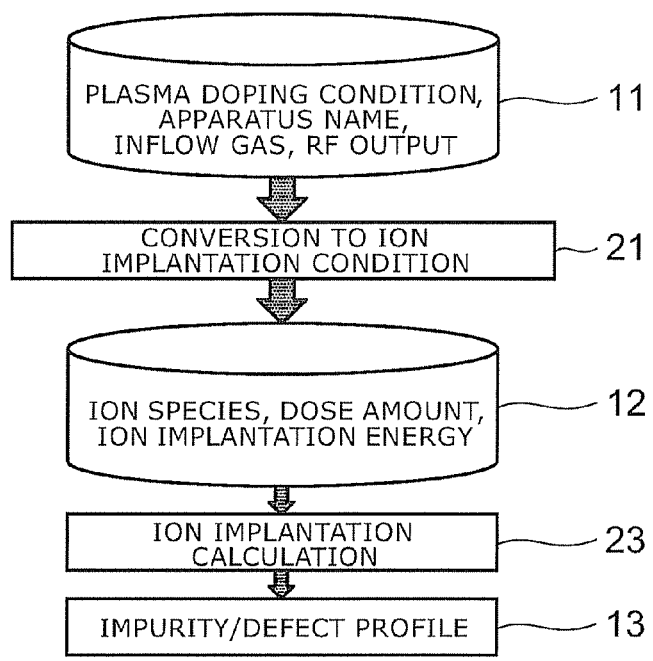
FIG. 2 is a schematic view showing the input/output relationship to the converter and the ion implantation calculation section in FIG. 1.

On the other hand, when the process based on plasma doping is simulated, the plasma doping condition is inputted through the input device 10. Subsequently, as shown in FIG. 2, the input data (plasma doping condition) 11 is outputted to the converter 21 and converted therein to ion implantation condition data (ion species, ion implantation energy, and dose amount) 12, which are then outputted to the ion implantation calculation section 23. In response, the ion implantation calculation section 23 calculates an impurity/defect profile 13 in the semiconductor.

Plasma doping is a technique in which a gas containing impurities to be implanted into the semiconductor and a carrier gas are introduced between opposed electrodes in a chamber under a desired reduced-pressure atmosphere, the introduced gases are turned into a plasma by application of electric power to the opposed electrodes, and the impurity ions generated in the plasma are accelerated toward and implanted into the semiconductor wafer under the electric field between the opposed electrodes.

Figure 6:
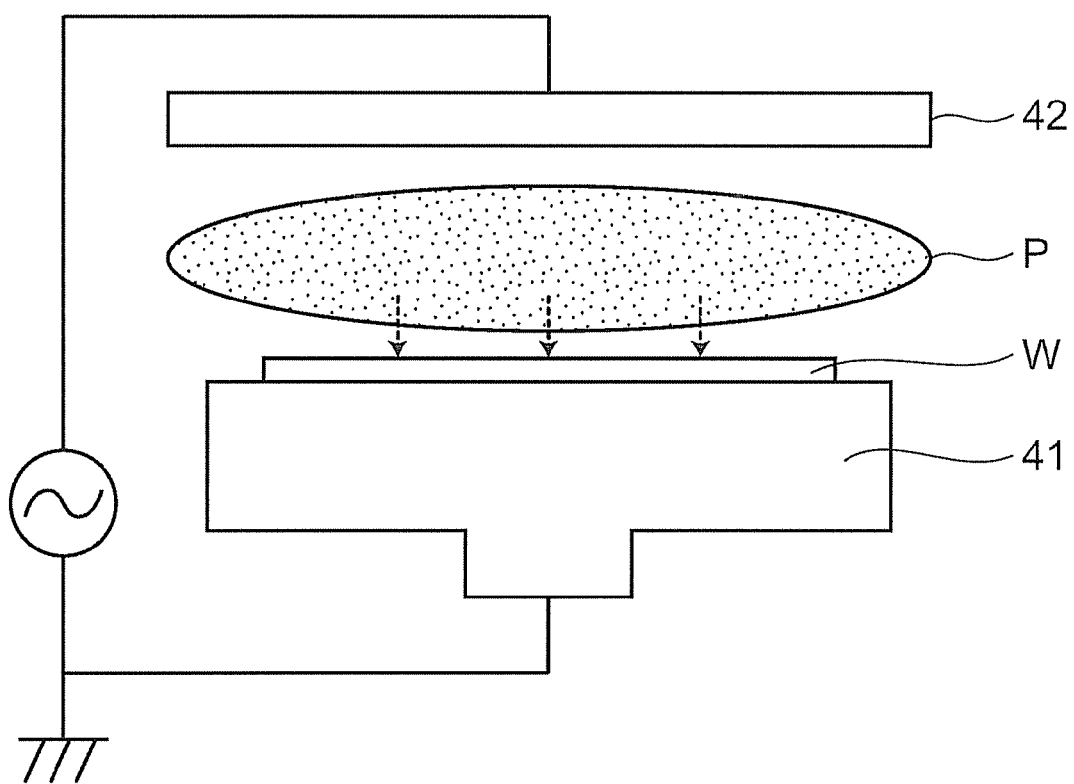
FIG. 6 is a schematic view of a plasma doping apparatus.

In a plasma doping apparatus schematically illustrated in FIG. 6, a wafer support unit 41 for, for instance, electrostatically chucking a semiconductor wafer W is used to function as one of the opposed electrodes, and a radio frequency power is applied between this wafer support unit 41 and the other electrode 42 opposed thereto to generate a plasma P from the gases introduced between the opposed electrodes in the chamber space. Here, in this embodiment, the semiconductor wafer W is illustratively a silicon wafer. However, the invention is applicable also to semiconductor wafers other than silicon.

In this embodiment, the plasma doping condition including the apparatus name, the flow rate for each inflow gas species into the chamber, and the output of the radio frequency power for generating a plasma in the chamber is given to the converter 21 through the input device 10 described above.

Figure 3:
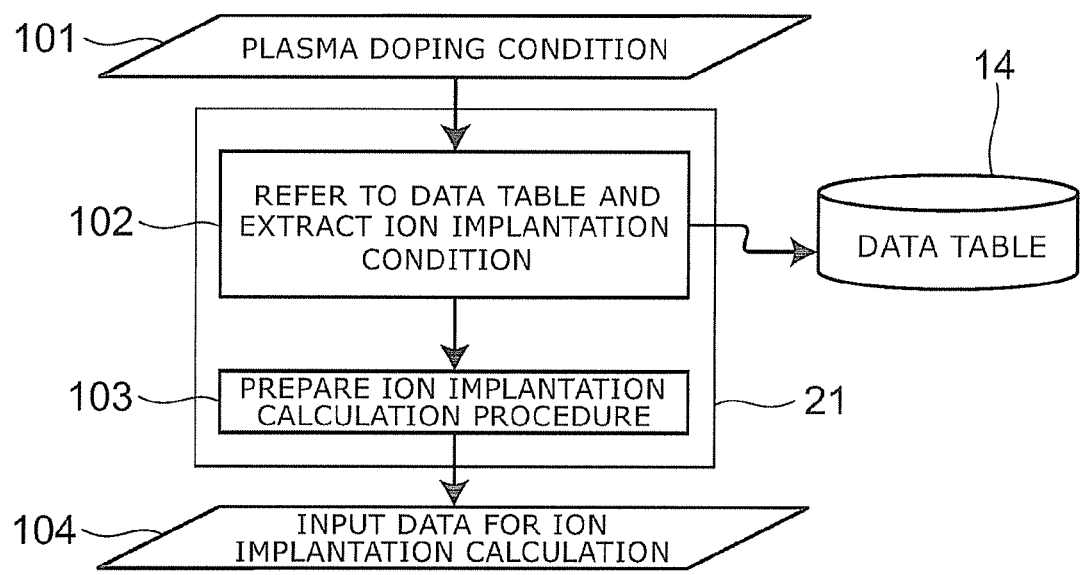
FIG. 3 is a flow chart showing the processing in the converter in FIG. 1.

Next, with reference to FIG. 3, the processing in the converter 21 is described.

Here, for instance, in the plasma doping condition data 101 received as input, the apparatus name is "A", the inflow gases into the chamber are $B_2H_6$ at 0.1 sccm and He at 5 sccm, and the radio frequency power output applied between the opposed electrodes is 400 W.

The plasma doping condition data 101 is inputted to the ion implantation condition extraction section 102 in the converter 21. In response, the ion implantation condition extraction section 102 refers to a data table stored in the memory section 14 and extracts ion implantation condition data corresponding to the plasma doping condition data 101.

FIG. 7 shows an example of the data table.

This data table associates the plasma doping condition (apparatus name, gas flow rate for each gas species, and radio frequency power output) with an ion implantation condition (ion species, ion implantation energy, and dose amount) considered equivalent thereto. For instance, the process of plasma doping under the condition of using the apparatus A at a He gas flow rate of 5 sccm, a $B_2H_6$ gas flow rate of 0.1 sccm, and a radio frequency power output of 300 W is considered equivalent to the process of ion-implanting boron (B), hydrogen (H), and helium (He) at a dose amount of $1.5 \times 10^{15}$ cm$^{-2}$, $4.5 \times 10^{15}$ cm$^{-2}$, and $1.0 \times 10^{17}$ cm$^{-2}$, respectively, all at an implantation energy of 0.4 keV. Thus, the plasma doping condition is converted to the ion implantation condition.

Correlation between the plasma doping condition and the ion implantation condition is prepared as a data table in advance and stored in the memory section 14. The converter 21 reads the data table from the memory section 14 and extracts an ion implantation condition corresponding to the inputted plasma doping condition.

When referring to the data table, if any condition matching the inputted plasma doping condition is found, the ion implantation condition corresponding thereto is extracted. If there is no matching condition, a corresponding ion implantation condition is extracted by interpolating data from the correlation between the plasma doping condition and the ion implantation condition in the data table.

For instance, there is a correspondence between the radio frequency power output in the plasma doping condition and the ion implantation energy in the ion implantation condition. These can be plotted along the vertical and horizontal axis to create graphical data, and the trend of plotted points therein can be used to interpolate an ion implantation energy corresponding to the radio frequency power output lacking in the table.

For instance, the table shown in TABLE 1 includes no plasma doping condition matching the aforementioned condition of the apparatus name A, $B_2H_6$ at 0.1 sccm, He at 5 sccm, and a radio frequency power output of 400 W. However, data interpolation based on the other data in the table yields an ion implantation condition in which B ions have an implantation energy of 0.5 keV and a dose amount of $1.5 \times 10^{15}$ cm$^{-2}$, H ions have an implantation energy of 0.5 keV and a dose amount of $4.5 \times 10^{15}$ cm$^{-2}$, and He ions have an implantation energy of 0.5 keV and a dose amount of $1.0 \times 10^{17}$ cm$^{-2}$.

Here, it is considered that in plasma doping, the plasma generated in the chamber contains not only monatomic ions but also other numerous ions including molecular ions. However, such other ions often hardly affect the simulation result. Hence, even major monatomic ions alone are sufficient for ions to be treated in the ion implantation condition in the data table.

For instance, in plasma doping based on He gas and $B_2H_6$ gas, even when monatomic ions of B, H, and He alone are used as ions in the corresponding ion implantation condition, sufficient simulation accuracy reflecting the actual plasma processing has been achieved. Alternatively, in this case, because the simulation result is significantly affected by B and He, sufficient accuracy can be expected even without taking H into consideration. Limiting the number of treated parameters serves to reduce the time required for data table preparation and calculation processing.

In the conversion of the plasma doping condition to the ion implantation condition, the invention is not limited to directly referring to the data table and extracting a corresponding equivalent ion implantation condition. It is also possible to substitute the inputted plasma doping condition into a pre-established correlation formula between the plasma doping condition and the ion implantation condition to calculate a corresponding ion implantation condition.

The corresponding ion implantation condition converted from the plasma doping condition is next inputted to a preparation section 103 for preparing input data for ion implantation calculation, which presents an ion implantation calculation procedure. As the calculation model for ion implantation calculation performed in the ion implantation calculation section 23 shown in FIG. 1 using the ion implantation condition data, the conventionally used Monte Carlo model or analysis model can be specified. The input data preparation section 103 arranges the ion implantation condition data in the input data format for the specified model.

Then, the ion implantation calculation section 23 performs ion implantation calculation using the input data 104 prepared by the input data preparation section 103. For instance, if the Monte Carlo model is specified, incident ions are expressed by numerous Monte Carlo particles. The scattering process and stop position of the Monte Carlo particles in the wafer are successively calculated, and crystal defects generated by scattering are calculated.

An example of input data prepared in the input data preparation section 103 is given in equation (1):

$$
\begin{aligned}
&B \quad Ene = E_1 \quad Dose = B_{B1} \\
&He \quad Ene = E_2 \quad Dose = D_{He1} \\
&B \quad Ene = E_1 \quad Dose = D_{B2} \\
&He \quad Ene = E_2 \quad Dose = D_{He2} \\
&\quad \vdots \qquad\qquad\qquad \vdots \\
&B \quad Ene = E_1 \quad Dose = D_{Bn} \\
&He \quad Ene = E_2 \quad Dose = d_{He2}
\end{aligned} \quad (1)
$$

where $D_{B1} + D_{B2} + \ldots + D_{Bn}$ = Total dose amount of $B$ $D_{He1} + D_{He2} + \ldots + D_{Hen}$ = Total dose amount of $He$ $E_1$ = $B$ ion implantation energy $E_2$ = $He$ ion implantation energy This shows an input data format for ion implantation calculation corresponding to the process of first ion-implanting B ions at ion implantation energy Ene=$E_1$ and dose amount Dose=$D_{B1}$, and then ion-implanting He at ion implantation energy Ene=$E_2$ and dose amount Dose=$D_{He1}$, followed by alternately repeating ion implantation of B ions and He ions.

Here, each dose amount $D_{B1}, D_{B2}, \ldots, D_{Bn}$ per iteration of ion implantation for B ions is set smaller than the total dose amount of B ions (obtained from the table of TABLE 1) so that the sum of the dose amounts for all the iterations, $D_{B1} + D_{B2} + \ldots + D_{Bn}$, equals the total dose amount. Likewise, each dose amount $D_{He1}, D_{He2}, \ldots, D_{Hen}$ per iteration of ion implantation for He ions is set smaller than the total dose amount of He ions (obtained from the table of TABLE 1) so that the sum of the dose amounts for all the iterations, $D_{He1} + D_{He2} + \ldots + D_{Hen}$, equals the total dose amount. The ion implantation energy $E_1$ and $E_2$ for B and He ions, respectively, are directly the values obtained from the table of TABLE 1.

In ion implantation, only desired ions filtered by an energy filter are implanted as ion beams into the semiconductor. In contrast, in plasma doping, besides the ions desired to be implanted into the semiconductor, various ions are generated (such as, in the aforementioned example, He ions resulting from the carrier gas, H ions resulting from the B-containing raw material gas $B_2H_6$, and other molecular ions). These ions are implanted into the semiconductor not in the required amount at once, but in small amounts over a plurality of iterations.

Thus, the data format given in equation (1) for B and He ions affecting the simulation result reflects more effectively the actual plasma doping process in which they are implanted alternately in small amounts over a plurality of iterations. This serves to increase the accuracy of the simulation result.

Here, it is also to be noted that the calculation procedure of B ion implantation is alternated with the calculation procedure of He ion implantation. More specifically, it is considered that in actual plasma doping, there is no phenomenon in which B ions are intensively implanted during one processing time period, and He ions are intensively implanted during another processing time period. Thus, in a model of plasma doping modeled on ion implantation, more accurate simulation reflecting the actual plasma doping process can be expected on the assumption that each ion species is alternately implanted in small amounts.

In the aforementioned example, for the implantation energy $E_1$ of B ions and the implantation energy $E_2$ of He ions, respectively, the same values extracted from the table of TABLE 1 are commonly used for every iteration. However, in contrast to ion implantation in which the implantation energy is easy to keep nearly constant throughout the processing time, in plasma doping in which ions are accelerated by a discharge electric field between opposed electrodes, the discharge electric field varies with variation in the plasma state and the like, and each ion species is not always implanted at the same energy throughout the processing time.

Thus, the table can list not only one but a plurality of implantation energies for the ion implantation condition corresponding to one plasma doping condition so that, for instance, in equation (1), $E_1$ is used for the first iteration of B implantation, and a value different from $E_1$ is used for the n-th iteration.

The aforementioned plasma doping process aims to implant B ions, which are impurity ions desired. However, He ions resulting from the carrier gas are also taken into consideration in the simulation because crystal defects caused by implantation of He ions are not negligible. Hence, simulation with implantation of He ions taken into consideration can reproduce an accurate simulation result reflecting the actual plasma doping process in which occurrence of crystal defects, or amorphization, associated with the progress of He ion implantation interferes with channeling of B ions.

Furthermore, in the actual plasma doping process, each ion species in the plasma is implanted in small amounts over a number of iterations. Hence, in the input data format of equation (1), an upper limit is preferably defined for each input statement, that is, for each dose amount $D_{Bn}$, $D_{Hen}$ implanted per iteration of ion implantation. For instance, for He ions, if the total dose amount obtained from the table of TABLE 1 is $1.0 \times 10^{17}$ cm$^{-2}$, the dose amount per iteration is set to $1.0 \times 10^{14}$ cm$^{-2}$ or less. This allows the simulation to reflect the actual plasma doping process in which crystal defects occur in small amounts during He ion implantation.

Furthermore, for instance, for He ions with the total dose amount being $1.0 \times 10^{17}$ cm$^{-2}$, if the dose amount per iteration is always constant at $1.0 \times 10^{14}$ cm$^{-2}$, the number of iterations of He ion implantation specified in equation (1) is necessarily determined as $10^3$. That is, setting the upper limit of the dose amount per iteration helps estimate the number of iterations of ion implantation and allows a user to prepare more easily an input data file for ion implantation calculation as given in equation (1).

Next, equation (2) gives another example of input data prepared by the input data preparation section 103.

B Ene=$E_1$ Dose=Total dose amount of B

He Ene=$E_2$ Dose=Total dose amount of He     (2)

This corresponds to the process in which the total dose amount obtained from the table of TABLE 1 is implanted at once in one iteration of ion implantation. For instance, this is applicable to a simulation reflecting the situation in which crystal defects due to He implantation occur in large numbers at the initial stage of implantation.

If an analysis model is specified as a calculation model in the ion implantation calculation section 23, ion implantation calculation can be performed by preparing a database which stores parameters of a distribution function for each ion species.

Figure 4A:
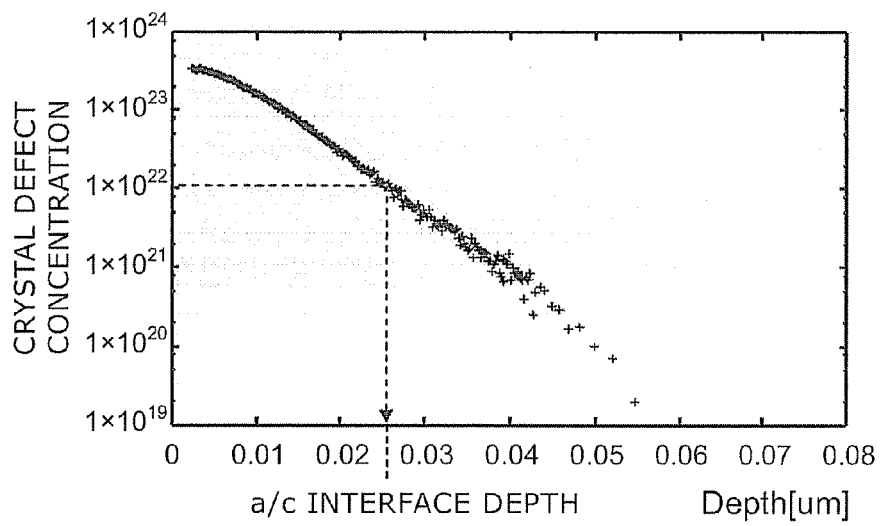
FIGS. 4A to 4C are graph showing one example of the device structure data obtained by the process simulation.
Figure 4B:
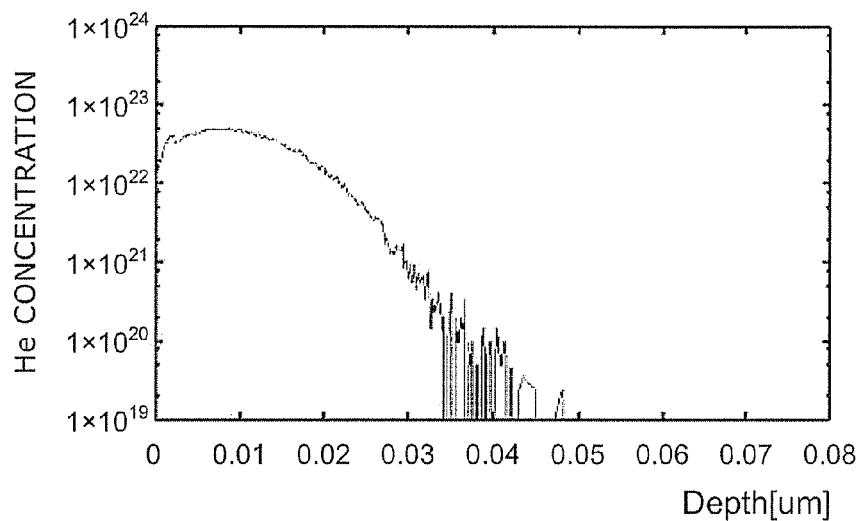
Figure 4C:
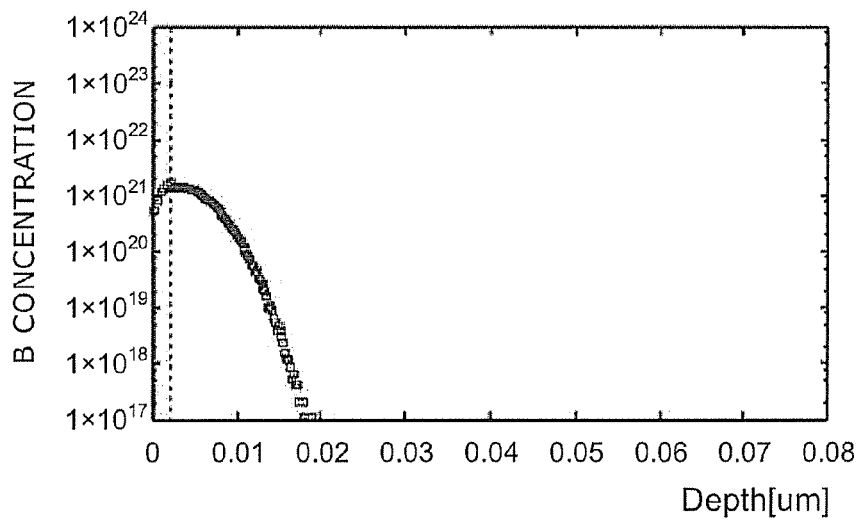

After the process described above, the ion implantation calculation section 23 performs various calculations to obtain the crystal defect concentration distribution, He concentration distribution, and B concentration distribution shown in FIGS. 4A to 4C, respectively. In each graph, the horizontal axis represents depth (μm) from the wafer surface whose depth is assumed zero. The vertical axis represents each concentration ($cm^{-2}$).

Furthermore, the crystal defect concentration distribution illustrated in FIG. 4A can be used to determine the interface depth between the amorphous layer and the crystal layer (a/c interface depth) in the wafer doped with impurities. For instance, the region where 20% or more of the silicon crystal is broken, that is, where the defect concentration is $1.0 \times 10^{22}$ $cm^{-2}$ or more, is considered as an amorphous layer, and the a/c interface depth proves to be approximately 27 nm.

Typically, the plasma doping process is followed by a diffusion process for diffusing the introduced impurities in the semiconductor. Thus, in the process simulator shown in FIG. 1, the calculation result in the ion implantation calculation section 23 is used for calculation in the diffusion calculation section 25. The diffusion calculation section 25 performs diffusion calculation using the crystal defect concentration distribution data and the impurity concentration distribution data obtained by the ion implantation calculation section 23. For instance, diffusion is calculated using a point defect impurity pair diffusion model, which also allows calculation for transient enhanced diffusion (TED).

In the processing device 20, each calculation section performs various calculations in accordance with the actual process, and the calculation results are ultimately stored as device structure data in the memory device 30. According to this embodiment, without newly providing a calculation section dedicated to plasma doping, the condition data is converted to model the plasma doping process on the ion implantation process. Thus, the existing ion implantation calculation sections can be used to simply and accurately perform process simulation for plasma doping. This serves to improve accuracy in the device structure data obtained by the process simulation, and in the electrical characteristics prediction of the device in the device simulation based on the device structure data.

The sequence of processes including calculations in the converter 21 and the ion implantation calculation section 23 described above is performed by the processing device 20 under the instructions of a process simulation program according to this embodiment loaded by the processing device 20. Hence, the process simulator according to this embodiment includes a memory device storing the aforementioned process simulation program (such as an optical disk device, magnetic disk device, and semiconductor memory) in addition to the input device 10 and the processing device 20. Here, the memory device 30 storing the device structure data may store also the aforementioned program.

Figure 5:
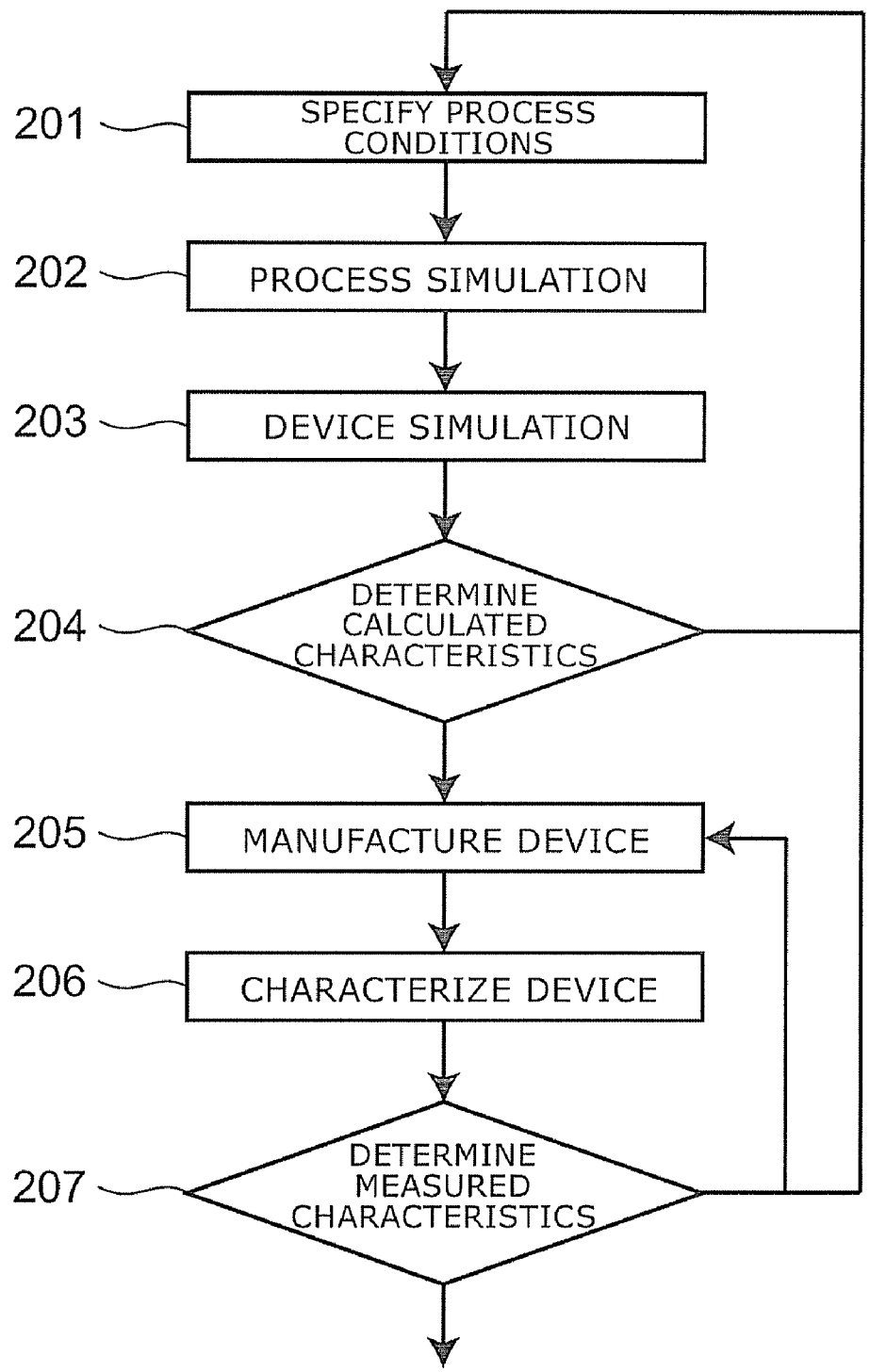
FIG. 5 is a flow chart of major steps in a semiconductor manufacturing method according to this embodiment.

Next, FIG. 5 shows a flow of major steps in a semiconductor device manufacturing method according to an embodiment of the invention.

In the process condition specifying step 201, a plurality of process conditions are specified. For the plurality of process conditions thus specified, the process simulation (step 202) and the device simulation (step 203) as described above are performed. In the device simulation, the device structure data obtained by the process simulation is used to calculate device characteristics data. This device characteristics data can be used to predict the electrical characteristics of the device. By performing simulation for a plurality of conditions, device characteristics data can be obtained for the plurality of conditions.

Subsequently, plasma doping conditions are evaluated on the basis of the device characteristics data, a plasma doping condition is specified on the basis of the evaluation, and a plasma doping process for introducing impurities into the semiconductor is performed by plasma doping based on the specified plasma doping condition.

Specifically, the calculated characteristics determination step 204 uses the device characteristics data to determine whether desired characteristics are obtained. If the desired characteristics are not obtained, a different condition is specified again in the process condition specifying step 201. If the desired characteristics are obtained, various processes are performed on an actual semiconductor wafer under that condition to manufacture a device (step 205).

Next, in the device characterization step 206, in addition to the electrical characteristics of the manufactured device, the oxide film thickness, temperature and the like during the manufacturing are measured.

Then, the measured characteristics determination step 207 determines whether the measurement values obtained in the above step 206 are as predicted. The wafer in which the oxide film thickness, temperature and the like measured in step 206 are different from the predicted values is likely to fail to achieve intended electrical characteristics. In this case, returning to the process condition specifying step 201, the optimal condition of the subsequent process for the wafer based on the measurement values is determined by simulation. Furthermore, the apparatus is adjusted so that values as predicted can be obtained in the device manufacturing steps for other wafers. If the electrical characteristics of the device are different from the predicted values, the prediction performance is increased by, for instance, improving the physical parameters of the calculation model.

Thus, the device design, development, and manufacturing can be made more efficient by using simulation.

The embodiments of the invention have been described with reference to examples. However, the invention is not limited to thereto, but can be variously modified within the spirit of the invention.

The plasma doping conditions and the corresponding ion implantation conditions described above are illustrative only, and can be suitably defined in accordance with the conditions of the actual plasma doping process.

The invention claimed is:

1. A semiconductor device manufacturing method comprising:
    converting condition data of plasma doping for introducing an impurity into a semiconductor in a plasma atmosphere to corresponding condition data of ion implantation for implanting an impurity as an ion beam into the semiconductor;
    calculating device structure data on the basis of the ion implantation condition data converted from the plasma doping condition data;
    evaluating the plasma doping condition data on the basis of the device structure data;
    specifying a plasma doping condition on the basis of the evaluation; and
    introducing an impurity in the semiconductor by plasma doping based on the specified plasma doping condition.

2. The method of claim 1, wherein the plasma doping condition data includes a gas species introduced into a chamber in which a plasma is generated, and the gas species is converted to an implanted ion species in ion implantation processing.

3. The method of claim 1, wherein the plasma doping condition data includes a flow rate of a gas introduced into a chamber in which a plasma is generated, and the gas flow rate is converted to a dose amount of ions in ion implantation processing.

4. The method of claim 1, wherein the plasma doping condition data includes an electric power for generating a plasma in a chamber, and the electric power is converted to an ion implantation energy in ion implantation processing.

5. The method of claim 1, wherein the plasma doping condition data is converted to the ion implantation condition data by referring to a data table which associates the plasma doping condition data with the ion implantation condition data considered equivalent thereto.

6. The method of claim 5, wherein a condition data of the ion implantation corresponding to the plasma doping condition data lacking in the data table is interpolated from correlation between the plasma doping condition data and the ion implantation condition data in the data table.

7. The method of claim 1, wherein
the ion implantation condition data includes a total dose amount specified for each ion species, and
the device structure data is calculated on an assumption that the ion species of the total dose amount are implanted into the semiconductor in a plurality of iterations with each dose amount per iteration smaller than the total dose amount.

8. The method of claim 7, wherein an upper limit is defined for the dose amount per the iteration.

9. The method of claim 1, wherein the device structure data is calculated on an assumption that different ion species are alternately implanted into the semiconductor.

* * * * *